United States Patent [19]

Shi et al.

[11] Patent Number: 5,766,779

[45] Date of Patent: *Jun. 16, 1998

[54] ELECTRON TRANSPORTING MATERIALS FOR ORGANIC ELECTROLUMINESCENT DEVICES

[75] Inventors: Jianmin Shi, Webster; Ching Wan Tang, Rochester; Chin Hsin Chen, Mendon, all of N.Y.

[73] Assignee: Eastman Kodak Company, Rochester, N.Y.

[ * ] Notice: The term of this patent shall not extend beyond the expiration date of Pat. No. 5,645,948.

[21] Appl. No.: 699,903

[22] Filed: Aug. 20, 1996

[51] Int. Cl.$^6$ ................................................. H05B 33/00
[52] U.S. Cl. .................... 428/690; 428/917; 428/704; 428/457; 313/504; 313/506
[58] Field of Search ........................... 428/690, 917, 428/704, 457; 313/504, 506

[56] References Cited

U.S. PATENT DOCUMENTS

| | | | |
|---|---|---|---|
| 4,885,211 | 12/1989 | Tang et al. | 428/457 |
| 5,645,948 | 7/1997 | Shi et al. | 428/690 |

FOREIGN PATENT DOCUMENTS

| | | |
|---|---|---|
| 6-228551 | 8/1994 | Japan . |
| 7-157473 | 6/1995 | Japan . |
| 7-310071 | 11/1995 | Japan . |

Primary Examiner—Marie Yamnitzky
Attorney, Agent, or Firm—Raymond L. Owens

[57] ABSTRACT

An organic EL device, comprising an anode and a cathode, and at least one electron injecting and transporting layer containing fluorescent materials;

the fluorescent materials contains a compound of benzazoles of the formula:

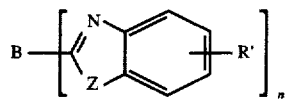

wherein:

n is an integer of from 2 to 8;

Z is —O—, —NR or —S—; and

R and R' are individually hydrogen; saturated aliphatic of from 1 to 24 carbon atoms, for example, propyl, t-butyl, heptyl, and the like; aryl of from 6 to 20 carbon atoms, for example, phenyl and naphthyl, furyl, thienyl, pyridyl quinolinyl and other heterocyclic systems; or halo such as chloro, fluoro, and the like; or R and R' individually comprise the atoms necessary to complete a fused aromatic ring;

B is a linkage unit which is able to conjugately, or unconjugately connect multiple benzazoles.

12 Claims, 2 Drawing Sheets

ELECTRON TRANSPORTING MATERIALS FOR ORGANIC ELECTROLUMINESCENT DEVICES

CROSS REFERENCE TO RELATED APPLICATION

Reference is made to commonly-assigned U.S. patent application Ser. No. 08/700,252, filed Aug. 20, 1996, now U.S. Pat. No. 5,645,948, entitled "Blue Organic Electroluminescent Devices" by Shi et al, the teaching of which is incorporated herein.

FIELD OF THE INVENTION

This invention relates to organic electroluminescent (EL) devices. More specifically, this invention relates to the use of a novel class of organic materials for the electron-transport layer in a multi-layer organic EL device.

BACKGROUND OF THE INVENTION

Organic EL devices are known to be highly efficient and are capable of producing a wide range of colors. Useful applications such as flat-panel displays have been contemplated. Representative of earlier organic EL devices are Gurnee et al U.S. Pat. No. 3,172,862, issued Mar. 9, 1965; Gurnee U.S. Pat. No. 3,173,050, issued Mar. 9, 1965; Dresner, "Double Injection Electroluminescence in Anthracene," RCA Review, Vol. 30, pp. 322–334, 1969; and Dresner U.S. Pat. No. 3,710,167, issued Jan. 9, 1973. Typical organic emitting materials were formed from a conjugated organic host material and a conjugated organic activating agent having condensed benzene rings. Naphthalene, anthracene, phenanthrene, pyrene, benzopyrene, chrysene, picene, carbazole, fluorene, biphenyl, terphenyls, quarterphenyls, triphenylene oxide, dihalobiphenyl, trans-stilbene, and 1,4-diphenylbutadiene were offered as examples of organic host materials. Anthracene, tetracene, and pentacene were named as examples of activating agents. The organic emitting material was present as a single layer medium having a thickness much above 1 micrometer. Thus, this organic EL medium was highly resistive and the EL device required a relatively high voltage (>100 volts) to operate.

The most recent discoveries in the art of organic EL device construction have resulted in devices having the organic EL medium consisting of extremely thin layers (<1.0 micrometer in combined thickness) separating the anode and cathode. Herein, the organic EL medium is defined as the organic composition between the anode and cathode electrodes. In a basic two-layer EL device structure, one organic layer is specifically chosen to inject and transport holes and the other organic layer is specifically chosen to inject and transport electrons. The interface between the two layers provides an efficient site for the recombination of the injected hole-electron pair and resultant electroluminescence. The extremely thin organic EL medium offers reduced resistance, permitting higher current densities for a given level of electrical bias voltage. Since light emission is directly related to current density through the organic EL medium, the thin layers coupled with increased charge injection and transport efficiencies have allowed acceptable light emission levels (e.g. brightness levels capable of being visually detected in ambient light) to be achieved with low applied voltages in ranges compatible with integrated circuit drivers, such as field effect transistors.

Further improvement in organic EL devices such as color, stability, efficiency and fabrication methods have been disclosed in U.S. Pat. Nos.: 4,356,429; 4,539,507; 4,720,432; 4,885,211; 5,151,629; 5,150,006; 5,141,671; 5,073,446; 5,061,569; 5,059,862; 5,059,861; 5,047,687; 4,950,950; 4,769,292, 5,104,740; 5,227,252; 5,256,945; 5,069,975, and 5,122,711; 5,366,811; 5,126,214; 5,142,343; 5,389,444; 5,458,977.

For the production of full-color EL display panel, it is necessary to have efficient red, green and blue (RGB) EL materials. With these primary materials, an appropriate combination of their emissions will generate any desirable EL hues or colors, including white. Especially important is the production of blue EL materials, because, given an efficient blue EL material, it is possible to produce other EL colors by a downhill energy transfer process. For instance, a green EL emission can be obtained by doping into a host blue EL material with a small amount of a green fluorescent sensitizing dye. This host-guest energy transfer scheme has been discussed in detail by Tang et al [U.S. Pat. No. 4,769,292]. Similarly, a red EL color can be produced by doping the blue EL host material with a red fluorescent dye. In a somewhat analogous scheme, the fluorescent sensitizing dye may be placed outside the blue EL emitter to effect a shift in the EL emission wavelengths, as discussed by Imai [U.S. Pat. No. 5,015,999]. In this scheme, the sensitizing medium absorbs the blue photon generated by the blue EL emitter, which then emits at longer wavelengths.

It has been discovered that a class of novel organic materials known as benzazoles is capable of producing highly efficient EL devices. In particular, the benzazoles are found to produce blue electroluminescence when they are used directly as the emitting layer in a multi-layer EL device as disclosed in commonly-assigned U.S. patent application Ser. No. 08/700,252 (now U.S. Pat. No. 5,645,948) to Shi et al cited above. It has been discovered that the benzazoles are capable of transporting electrons efficiently and therefore they can be used advantageously as the electron-transport layer in conjunction with other emissive materials in a multi-layer EL device.

SUMMARY OF THE INVENTION

The present invention provides a wide bandgap electron-transport material useful for organic EL devices;

the organic EL devices comprising an anode, a cathode, and an organic EL medium between the anode and the cathode;

the EL medium contains an electron-transport layer; the electron-transport layer contains a benzazole compound of molecular formula (1):

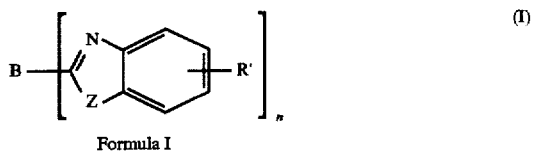

Formula I wherein:

n is an integer of from 2 to 8;

Z is O, NR or S; and

R and R' are individually hydrogen; alkyl of from 1 to 24 carbon atoms, for example, propyl, t-butyl, heptyl, and the like; aryl or hetero-atom substituted aryl of from 5 to 20 carbon atoms, for example, phenyl and naphthyl, furyl, thienyl, pyridyl, quinolinyl and other heterocyclic systems; or halo such as chloro, fluoro; or atoms necessary to complete a fused aromatic ring;

B is a linkage unit consisting of alkyl, aryl, substituted alkyl, or substituted aryl which conjugately or unconjugately connects the multiple benzazoles together.

BRIEF DESCRIPTION OF THE DRAWINGS

These and other advantages of this invention can be better appreciated by reference to the following detailed description considered in conjunction with the drawings in which.

DETAILED DESCRIPTION OF THE PREFERRED EMBODIMENTS

Figure 1:
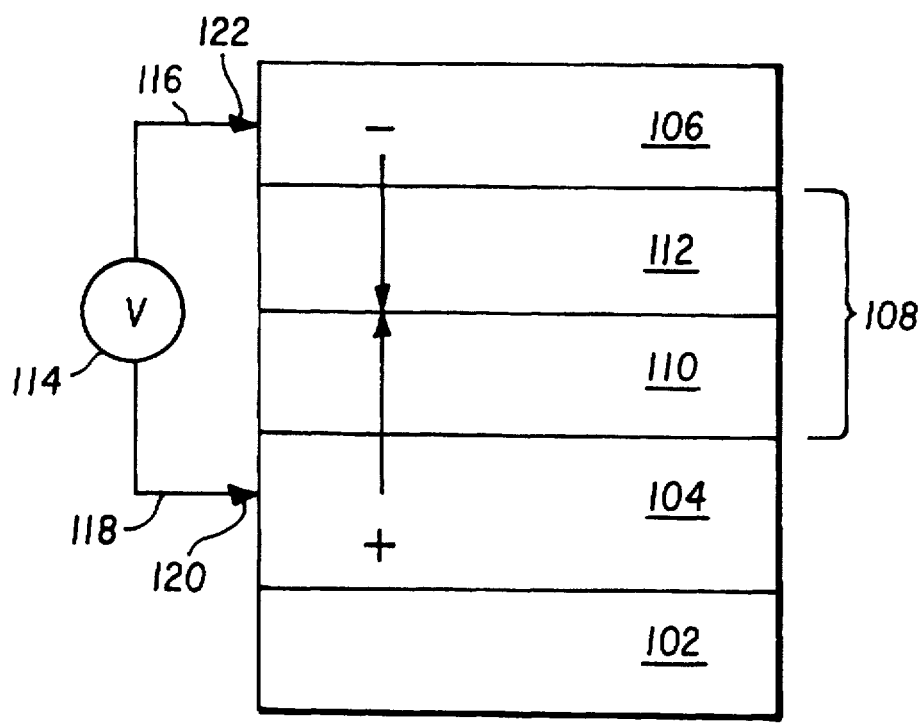
FIGS. 1, 2, and 3 are schematic diagrams of the multilayer structures of preferred EL devices of this invention.

An EL device 100 according to the invention is schematically illustrated in FIG. 1. The support is layer 102 which is an electrically insulating and optically transparent material such as glass or plastic. Anode 104 is separated from cathode 106 by an organic EL medium 108, which, as shown, consists of two superimposed layers of organic thin films. Layer 110 located on the anode forms a hole-transport layer of the organic EL medium. Located above the hole-transport layer is layer 112, which forms an electron-transport layer of the organic EL medium. The anode and the cathode are connected to an external AC or DC power source 114 by conductors 116 and 118, respectively. The power source can be pulsed, periodic, or continuous.

In operation, the EL device can be viewed as a diode which is forward biased when the anode is at a higher potential then the cathode. Under these conditions, holes (positive charge carriers) are injected from the anode into the hole-transport layer, and electrons are injected into the electron-transport layer. The injected holes and electrons each migrate toward the oppositely charged electrode, as shown by the arrows 120 and 122, respectively. This results in hole-electron recombination and a release of energy in part as light, thus producing electroluminescence.

The region where the hole and electron recombine is known as the recombination zone. The two-layer device structure is designed specifically to confine the recombination at the vicinity near the interface between the hole-transport and the electron-transport layers where the probability for producing electroluminescence is the highest. This recombination confinement scheme has been disclosed by Tang and Van Slyke [Applied Physics Letters, Volume 51, Page 913, 1987] and is done by choosing carrier injecting electrodes of suitable work-functions and transport materials of a proper carrier mobility. Away from this interface between the organic layers and in particular at or near the injecting electrodes, the recombination of hole and electron would generally be much less radiative due to the effect of radiative quenching by a conducting surface.

Figure 2:
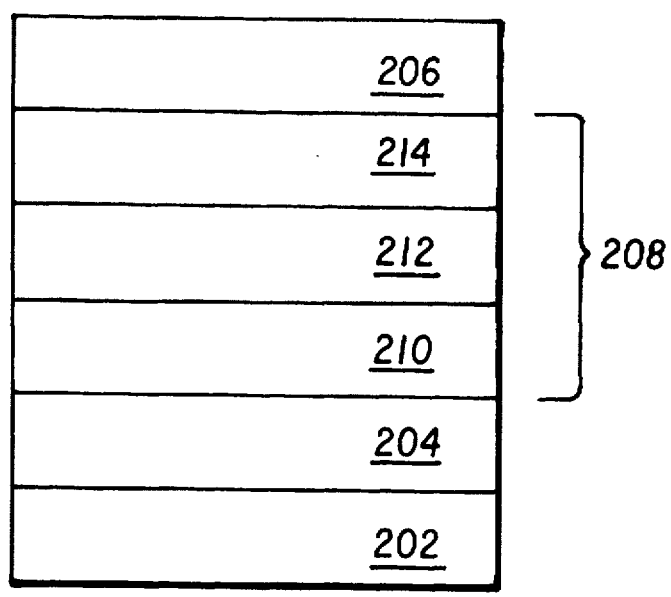

Organic EL device 200 shown in FIG. 2 is illustrative of another preferred embodiment of the invention. The insulating and transparent support is layer 202. The anode 204 is separated from the cathode 206 by an EL medium 208, which, as shown, consists of three superimposed layers of organic thin films. Layer 210 adjacent to anode 204 is the hole-transport layer. Layer 214 adjacent to cathode 206 is the electron-transport layer. Layer 212 which is in between the hole-transport layer and the electron transport layer is the luminescent layer. This luminescent layer also serves as the recombination layer where the hole and electron recombines.

The configurations of devices 100 and 200 are similar, except that an additional luminescent layer is introduced in device 200 to function primarily as the site for hole-electron recombination and thus electroluminescence. In this respect, the functions of the individual organic layers are distinct and can therefore be optimized independently. Thus, the luminescent or recombination layer can be chosen to have a desirable EL color as well as a high luminance efficiency. Likewise, the electron and hole transport layers can be optimized primarily for the carrier transport property.

Organic device 300 is illustrative of yet another preferred embodiment of the present invention. The insulating and transparent support is layer 302. The anode 304 is separated from the cathode 306 by an EL medium 308, which, as shown, consists of five superimposed layers of organic thin films. Located on top of the anode layer 304 are, in sequence, the hole-injection layer 310, the hole-transport layer 312, the luminescent layer 314, the electron-transport layer 316, and the electron-injection layer 318. The structure of device 300 is similar to device 200, except that a hole-injection layer and an electron injection layers are added to improve the injection efficiency of the respective anode and cathode. It is understood that an EL device may be constructed having either the hole or electron injection layer present in the organic EL medium without unduly compromising the device performance.

The substrate for the EL devices 100, 200, and 300 is electrically insulating and light transparent. The light transparent property is desirable for viewing the EL emission through the substrate. For applications where the EL emission is viewed through the top electrode, the transmissive characteristic of the support is immaterial, and therefore any appropriate substrate such as opaque semiconductor and ceramic wafers can be used. Of course, it is necessary to provide in these device configurations a light transparent top electrode.

The composition of the organic EL medium is described as follows, with particular reference to device structure 300.

Figure 3:
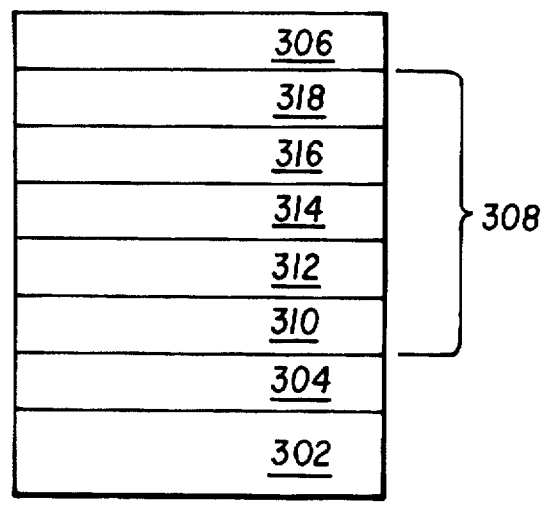

A layer containing a porphyrinic compound forms the hole injecting layer [Layer 310 of FIG. 3] of the organic EL device. A porphyrinic compound is any compound, natural or synthetic, which is derived from or includes a porphyrin structure, including porphine itself. Any of the prophyrinic compounds disclosed by Adler, U.S. Pat. No. 3,935,031 or Tang U.S. Pat. No. 4,356,429, the disclosures of which are here incorporated by reference, can be employed.

Preferred porphyrinic compounds are those of structural formula (II):

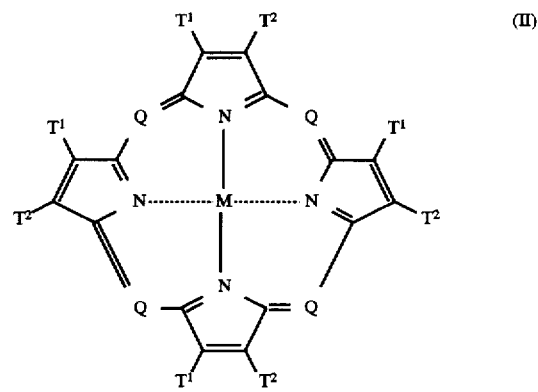

wherein

Q is —N= or —C(R)=;

M is a metal, metal oxide, or metal halide;

R is hydrogen, alkyl, aralkyl, aryl, or alkaryl; and $T^1$ and $T^2$ represent hydrogen or together complete a unsaturated six member ring, which can include substituents, such as alkyl or halogen. Preferred six membered rings are those formed of carbon, sulfur, and nitrogen ring atoms. Preferred alkyl moieties contain from about 1 to 6 carbon atoms while phenyl constitutes a preferred aryl moiety.

In an alternative preferred form the porphyrinic compounds differ from those of structural formula (I) by substitution of two hydrogens for the metal atom, as indicated by formula (III):

(III)

Highly preferred examples of useful porphyrinic compounds are metal free phthalocyanines and metal containing phthalocyanines. While the porphyrinic compounds in general and the phthalocyanines in particular can contain any metal, the metal preferably has a positive valence of two or higher. Exemplary preferred metals are cobalt, magnesium, zinc, palladium, nickel, and, particularly, copper, lead, and platinum.

Illustrative of useful porphyrinic compounds are the following:

Porphine 1,10,15,20-tetraphenyl-21H,23H-porphine copper (II)

1,10,15,20-tetrapheyl-21H,23H-porphine zinc (II)

Copper phthlocyanine

Chromium phthalocyanine fluoride

The hole transporting layer [312] of the organic EL device contains at least one hole transporting aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monarylamine, diarylamine, triarylamine, or a polymeric arylamine. Exemplary monomeric triarylamines are illustrated by Klupfel et al U.S. Pat. No. 3,180,730. Other suitable triarylamines substituted with vinyl or vinyl radicals and/or containing at least one active hydrogen containing group are disclosed by Brantley et al U.S. Pat. Nos. 3,567,450 and 3,658,520.

Another class of aromatic tertiary amines are those which include at least two aromatic tertiary amine moieties. Such compounds include those represented by structural formula (IV).

$$Q^1\diagdown_G\diagup Q^2 \qquad (IV)$$

wherein $Q^1$ and $Q^2$ are independently aromatic tertiary amine moieties and

G is a ling group such as an arylene, cycloalkylene, or alkylene group of a carbon to carbon bond.

A preferred class of triarylamines satisfying structural formula (IV) and containing two triarylamine moieties are those satisfying structural formula (V):

$$R^1-\underset{\underset{R^4}{|}}{\overset{\overset{R^2}{|}}{C}}-R^3 \qquad (V)$$

where $R^1$ and $R^2$ each independently represents a hydrogen atom, an aryl group, or an alkyl group or $R^1$ and $R^2$ together represent the atoms completing a cycloalkyl group and $R^3$ and $R^4$ each independently represents an aryl group which is in turn substituted with a diaryl substituted amino group, as indicated by structural formula (VI):

$$-N\diagup^{R^5}_{\diagdown R^6} \qquad (VI)$$

wherein $R^5$ $R^6$ are independently selected aryl groups.

Another preferred class of aromatic tertiary amines are tetraaryldiamines. Preferred tetraaryldiamines include two diarylamino groups, such as indicated by formula (VII), linked through an arylene group:

$$\underset{Ar}{R^7}\diagup N+Ar\underset{}{\rightarrow_n}N\diagdown\underset{R^9}{R^8} \qquad (VII)$$

wherein

Are is an arylene group, n is an integer of from 1 to 4, and

Ar, $R^7$, $R^8$, and $R^9$ are independently selected aryl groups.

The various alkyl, alkylene, aryl, and arylene moieties of the foregoing structural formulae (IV), (V), (VII), can each in turn be substituted. Typical substituents including alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are preferably phenyl and phenylene moieties.

Illustrative of useful hole transport compounds are the following:

-continued

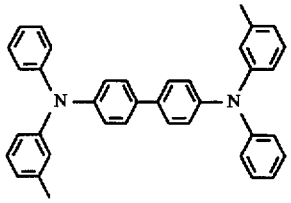

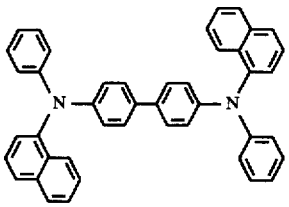

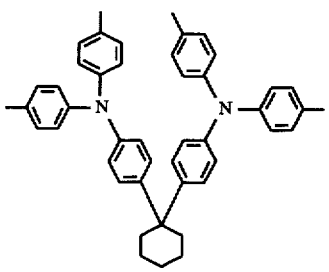

The luminescent layer [Layer 314 of FIG. 3] of the organic EL medium comprises of a luminescent or fluorescent material where electroluminescence is produced as a result of electron-hole pair recombination in this region. In the simplest construction, the luminescent layer comprises of a single component, that is a pure material with a high fluorescent efficiency. A well known material is tris (8-quinolinato) Aluminum, (Alq), which produces excellent green electroluminescence. A preferred embodiment of the luminescent layer comprises a multi-component material consisting of a host material doped with one or more components of fluorescent dyes. Using this method, highly efficient EL devices can be constructed. Simultaneously, the color of the EL devices can be tuned by using fluorescent dyes of different emission wavelengths in a common host material. This dopant scheme has been described in considerable details for EL devices using Alq as the host material by Tang et al [J. Applied Physics, Vol. 65, Pages 3610–3616, 1989; U.S. Pat. No. 4,769,292].

An important relationship for choosing a fluorescent dye as a dopant capable of modifying the hue of light emission when present in a host material is a comparison of their bandgap potential which is defined as the energy difference between the highest occupied molecular orbital and the lowest unoccupied molecular orbital of the molecule. For efficient energy transfer from the host to the dopant molecule, a necessary condition is that the bandgap of the dopant is smaller than that of the host material. An advantage of using a blue host such as benzazole is that its bandgap is sufficiently large to effect energy transfer to a range of commonly available fluorescent dyes emitting in the blue. These blue dopants includes coumarins, stilbenes, distyrylstilbenes, derivatives of anthracene, tetracene, perylene, and other conjugated benzenoids. Other dopants for EL emissions at longer wavelengths include coumarins, rhodamines and other green or red emitting fluorescent dyes.

In the practice of the present invention, the class of organic materials useful in forming the electron-transport layer [Layer 316 of FIG. 3.] of the organic EL devices has the molecular formula as follows:

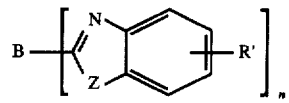

Formula I wherein:

n is an integer of from 2 to 8;

Z is O, NR or S; and

R and R' are individually hydrogen; alkyl of from 1 to 24 carbon atoms, for example, propyl, t-butyl, heptyl, and the like; aryl or hetero-atom substituted aryl of from 5 to 20 carbon atoms, for example, phenyl and naphthyl, furyl, thienyl; or halo such as chloro, fluoro; or atoms necessary to complete a fused aromatic ring;

B is a linkage unit consisting of alkyl, aryl, substituted alkyl, or subsituted aryl which corjugately or unconjugately connects the multiple benzazoles together.

Group 1:

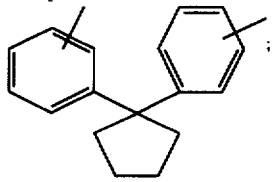

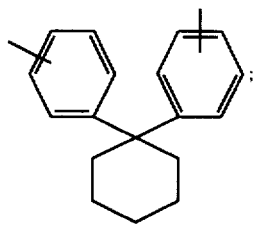

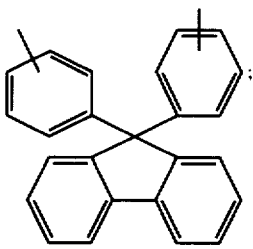

Group 2:

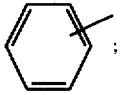

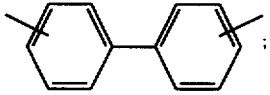

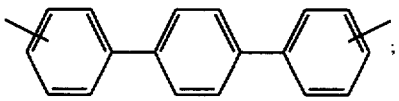

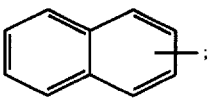

-continued

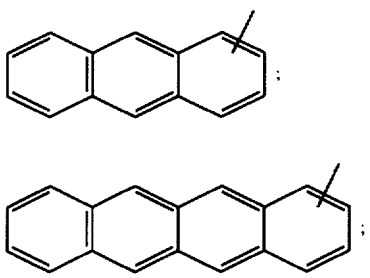

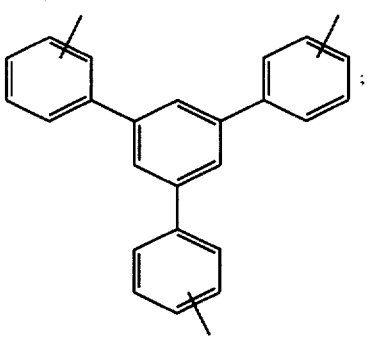

Group 3:

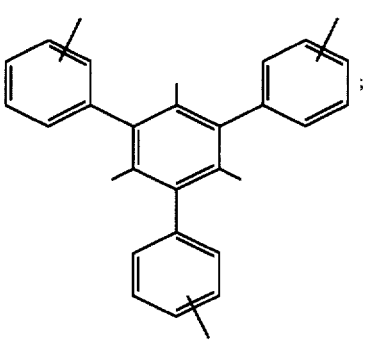

Group 4:

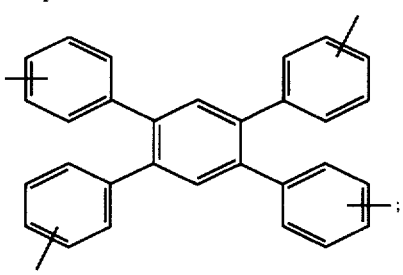

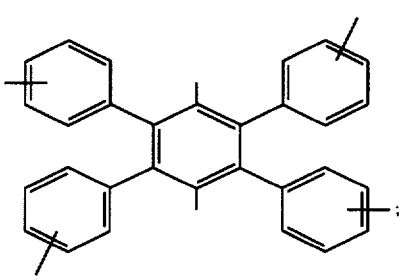

-continued

Group 5:

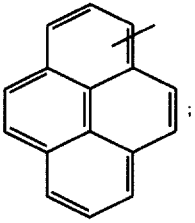

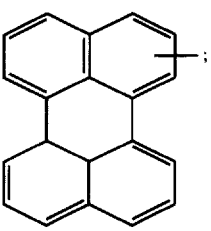

Group 6:

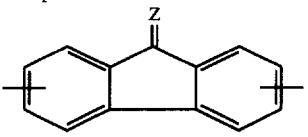

in which Z is O or C(CN)$_2$;

Group 7:

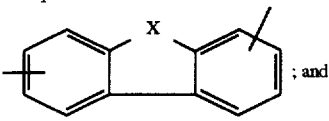
; and

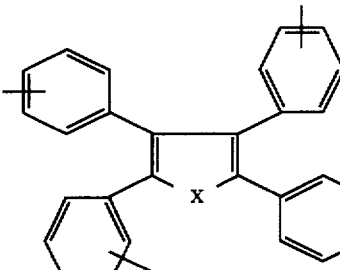

in which X is O, S, SO$_2$, CH$_2$, CHR$^1$, CR$^2$R$^3$, or NR$^4$, and R$^1$, R$^2$, R$^3$ and R$^4$; are individually hydrogen; saturated aliphatic of from 1 to 24 carbon atoms, for example, propyl, t-butyl, heptyl, and the like; aryl of from 6 to 20 carbon atoms, for example, phenyl and naphthyl; or halo such as chloro, fluoro, and the like; or and R$^4$ individually comprise the atoms necessary to complete a fused aromatic ring;

Group 8:

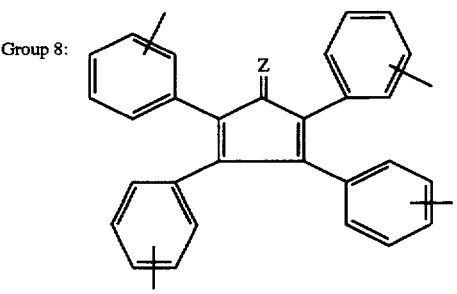

-continued in which Z is O or C(CN)₂; and

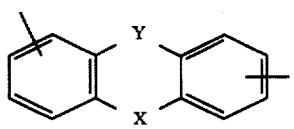

in which X and Y are individually O, S, SO₂, CH₂, CHR¹, CR²R³, or NR⁴, and R¹, R², R³ and R⁴; are individually hydrogen; saturated aliphatic of from 1 to 24 carbon atoms, for example, propyl, t-butyl, heptyl, and the like; aryl of from 6 to 20 carbon atoms, for example, phenyl and naphthyl; or halo such as chloro, fluoro, and the like; or R², R³ and R⁴ individually comprise the atoms necessary to complete a fused aromatic ring;

Group 9:

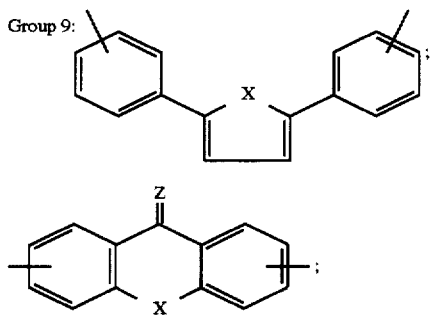

-continued

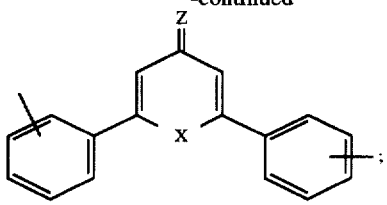

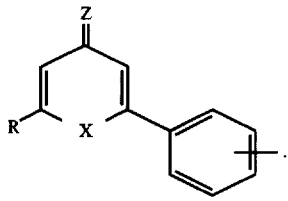

in which Z is O or C(CN)₂; X is O, S, SO₂, CH₂, CHR¹, CR²R³, or NR⁴, and R¹, R², R³ and R⁴; are individually hydrogen; saturated aliphatic of from 1 to 24 carbon atoms, for example, propyl, t-butyl, heptyl, and the like; aryl of from 6 to 20 carbon atoms, for example, phenyl and naphthyl; or halo such as chloro, fluoro, and the like; or R³ and R⁴ individually comprise the atoms necessary to complete a fused aromatic ring.

The following molecular structures constitute specific examples of preferred benzazoles satisfying the requirement of the invention:

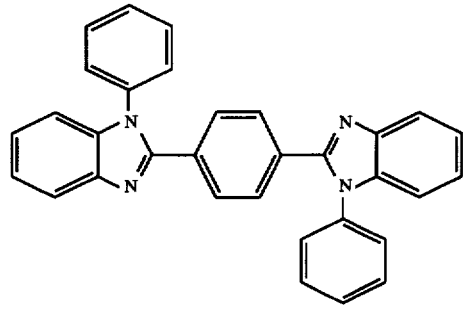

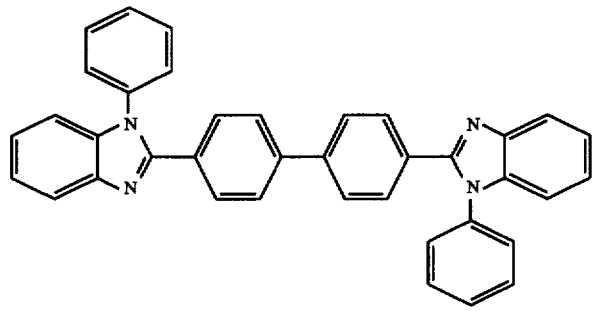

-continued
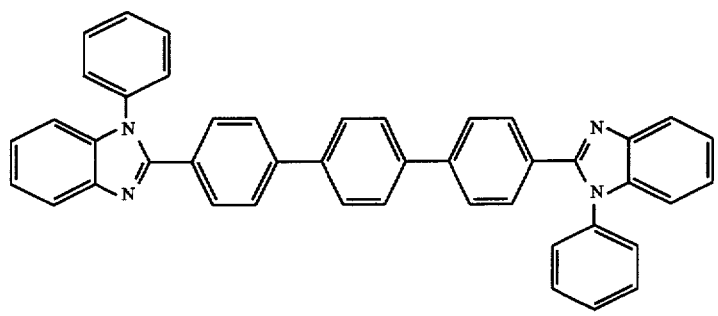
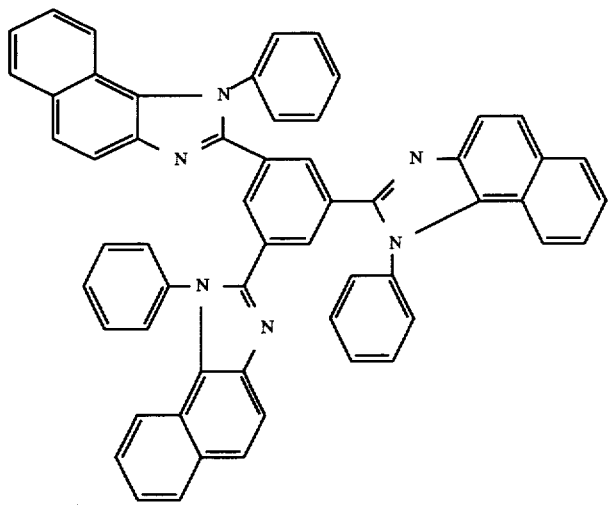
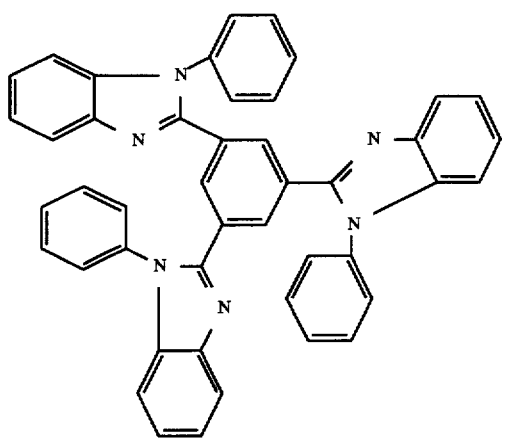

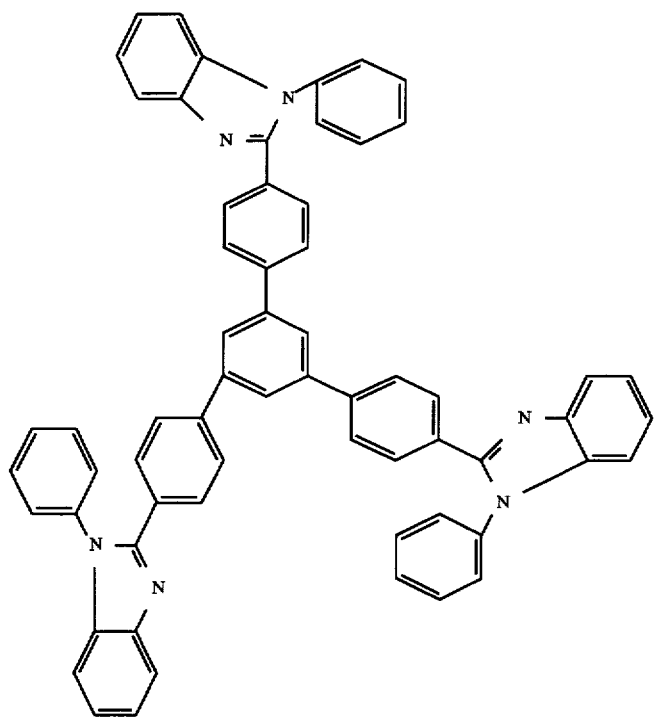
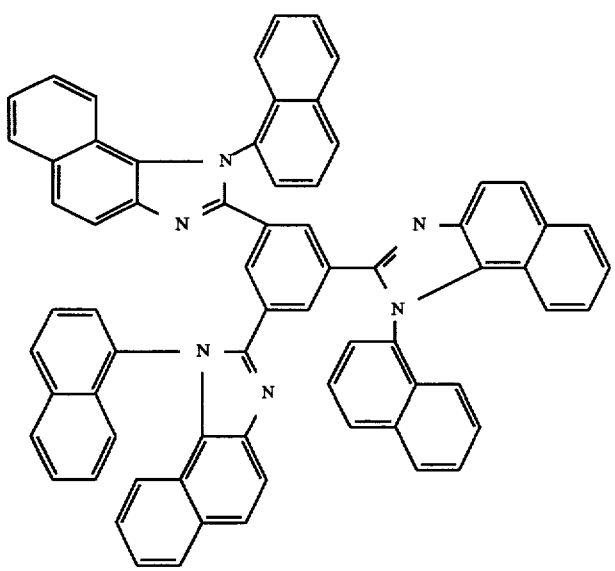

-continued
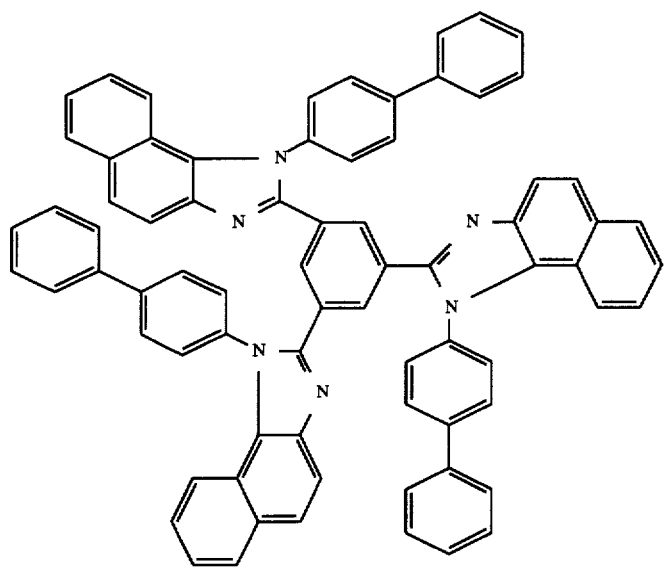
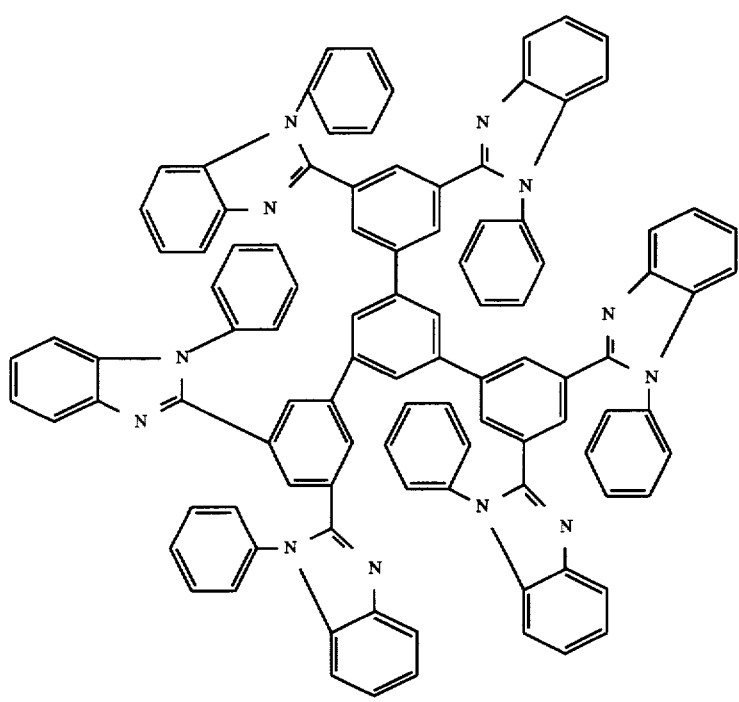

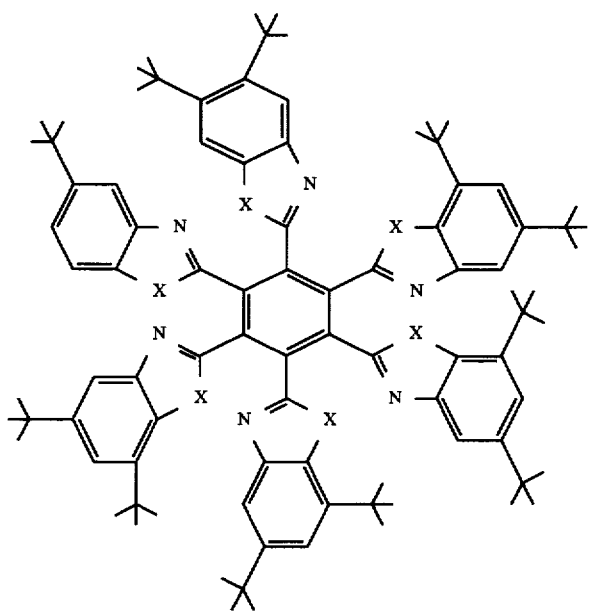
X = S, O.
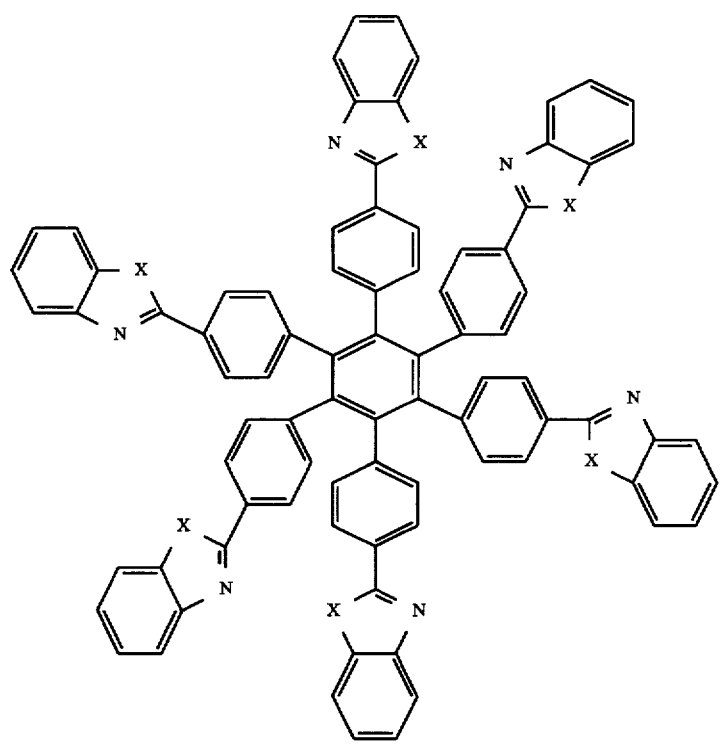
X = S, O.

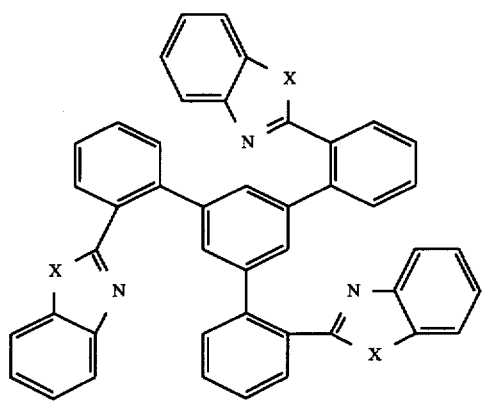
X = S, O, NAr
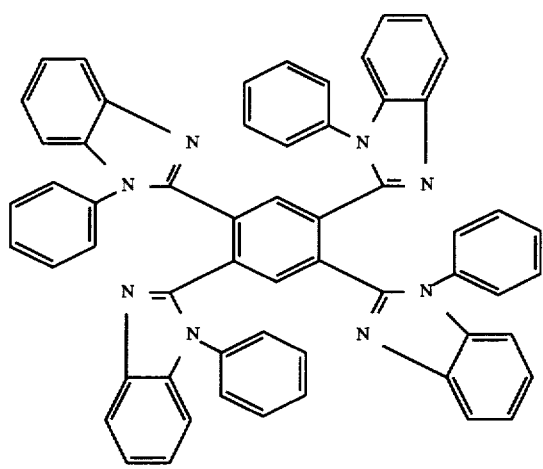
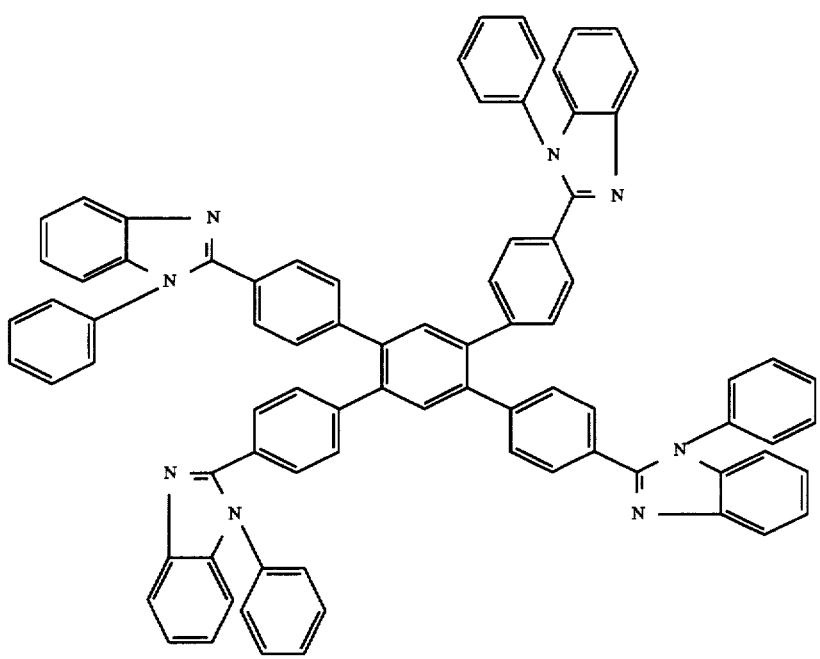

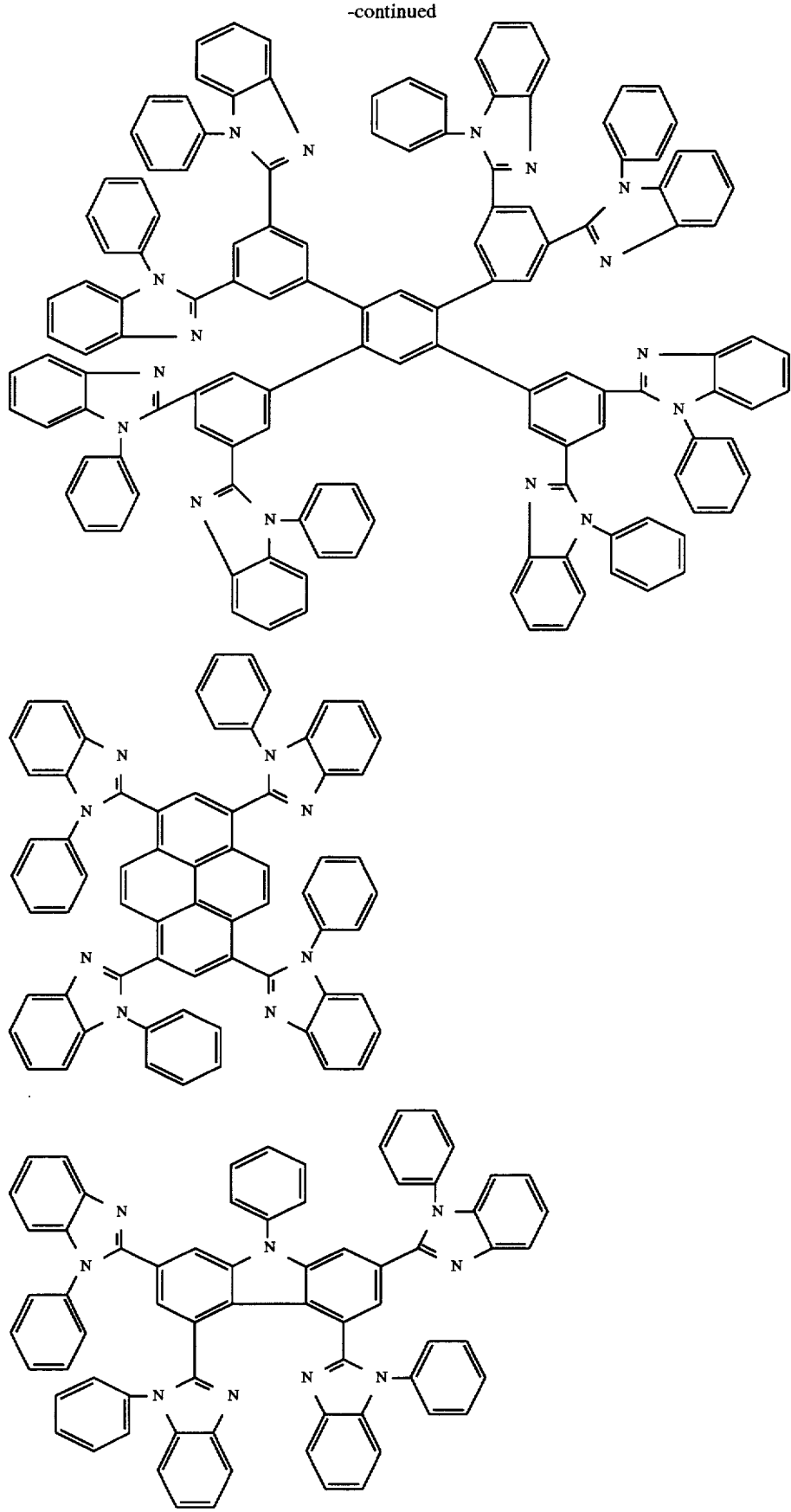

-continued

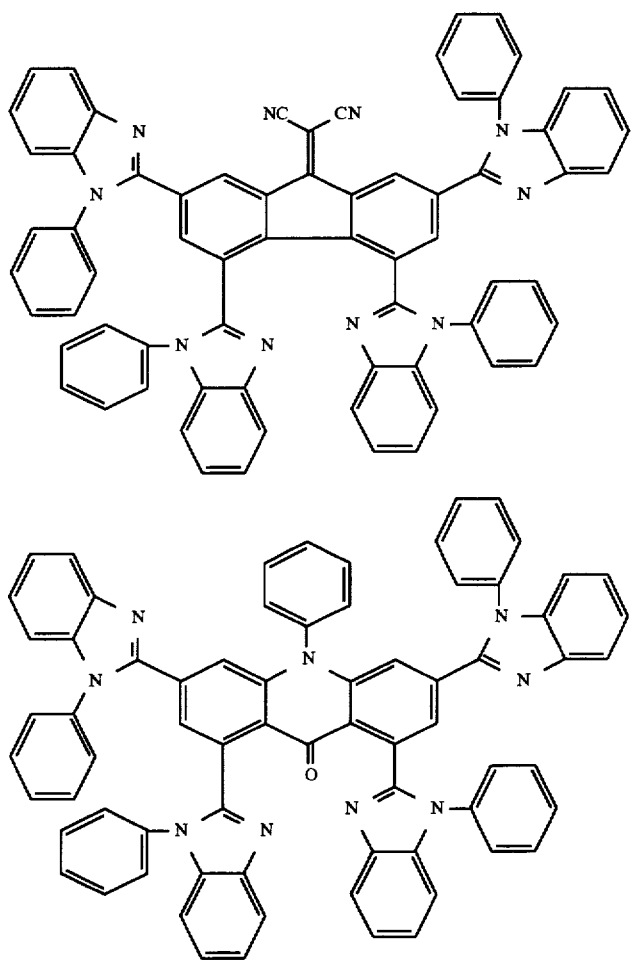

The electron-transport layer of the organic EL medium preferably should have a high electron mobility. A high mobility material would result in lower voltage drop across the transport layer and therefore a higher efficiency for the EL device. In addition, it is highly desirable for the electron-transport material to have a wide bandgap, i.e. with an energy gap in excess of 2.00 eV. With a wide bandgap electron-transport material, the EL emission from the luminescent layer which is sandwiched between the hole-transport layer and the electron-transport layer can transmit through the electron-transport layer without attenuation by absorption. More importantly, a wide bandgap transport material would make the energy or charge transfer from the luminescent layer back to the transport layer less favorable, thus confining the light emission primarily in the luminescent layer.

The preferred materials for the multi-layers of the organic EL medium are each capable of film-forming—that is, capable of being fabricated as a continuous layer having a thickness of less than 5000 Å. A preferred method for forming the organic EL medium is by vacuum vapor deposition. Extremely thin defect-free continuous layers can be formed by this method. Specifically, the individual layer thickness as low as about 50 Å can be constructed while still realizing satisfactory EL device performance. It is generally preferred that the overall thickness of the organic EL medium be at least about 1000 Å.

Other methods for forming thin films in EL devices of this invention include spin-coating from a solution containing the EL material. A combination of spin-coating method and vacuum vapor deposition method is also useful for the fabrication of multi-layer EL devices.

The anode and cathode of the organic EL device can each take any convenient conventional form. Where it is intended to transmit light from the organic EL device through the anode, this can be conveniently achieved by coating a thin conductive layer onto a light transparent substrate—e.g., a transparent or substantially transparent glass plate or plastic film. In one form the organic EL devices of this invention can follow the historical practice of including a light transparent anode formed of tin oxide or indium tin oxide coated on a glass plate, as disclosed by Gurnee et al U.S. Pat. No. 3,172,862, Gurnee U.S. Pat. No. 3,173,050, Dresner "Double Injection Electroluminescence in Anthracene", RCA Review, Volume 30, pages 322–334, 1969; and Dresner U.S. Pat. No. 3,710,167 cited above.

The organic EL devices of this invention can employ a cathode constructed of any metal, including any high or low work function metal, heretofore taught to be useful for this purpose. Unexpected fabrication, performance, and stability advantages have been realized by forming the cathode of a combination of a low work function metal and at least one other metal. For further disclosure, see U.S. Pat. No. 4,885,211 by Tang and Van Slyke, the disclosure of which is incorporated by reference herein.

EXAMPLES

The invention and its advantages are further illustrated by the specific examples as follows:

Example 1
Synthesis of 1,3,5-tis(N-phenyl-N-phenylarnino)benzarnide

To a solution of N-phenyl-1,2-phenylenediamine (16.6 g, 0.09 mol) in 100 mL of N-methyl pyrrolidinone was added 1,3,5-benzenetricarbonyl chloride (8.0 g, 0.03 mol) in portion at room temperature under nitrogen. The reaction mixture was stirred at room temperature for two hours then raise the reaction temperature to 50° C. for another half hour. After cooling the reaction mixture was poured into 300 ml of cool water with stirring. The resulted precipitates were filtered and washed with water. After drying, the tribenzamide was collected to give 19.5 g. (yield 92%).

Example 2
Synthesis of 2,2',2"-(1,3,5-phenylene)tris[1-phenyl-1H-benzimnidazolel](TPBI)

TPBI was prepared by heating 1,3,5-tris(N-phenyl-N-phenylamino)benzamide in 0.3 atm. nitrogen pressure at 280°–295° C. for about one hour. The pure TPBI (which can be used directly for cell fabrication) was obtained by sublimation twice at 315° C. at 2 Torr pressure.

Example 3
EL device fabrication and performance

An EL device satisfying the requirements of the invention was constructed in the following manner. The device structure has three organic layers, namely, a hole-injection layer, a hole transport layer and an electron-transport layer.

a) An indium-tin-oxide (ITO) coated glass substrate was sequentially ultrasonicated in a commercial detergent, rinsed in deionized water, degreased in toluene vapor and exposed to ultraviolet light and ozone for a few minutes.

b) A hole injection layer of copper phthalocyanine (150 Å) was then deposited on top of the ITO coated substrate by evaporation from a tantalum boat.

c) Onto the copper phthalocyanine layer was deposited a hole transport layer of N,N'-bis-(1-naphthyl)-N,N'-diphenylbenzidine (600 Å), also by evaporation from a tantalum boat.

d) An electron-transport layer of TPBI (500 Å) was then deposited onto the hole transporting layer.

e) On top of the TPBI layer was deposited a 2000 Å cathode formed of a 10:1 atomic ratio of Mg and Ag.

The above sequence completed the deposition of the EL device. The device was then hermetically packaged in a dry glove box for protection against ambient environment.

Figure 4:
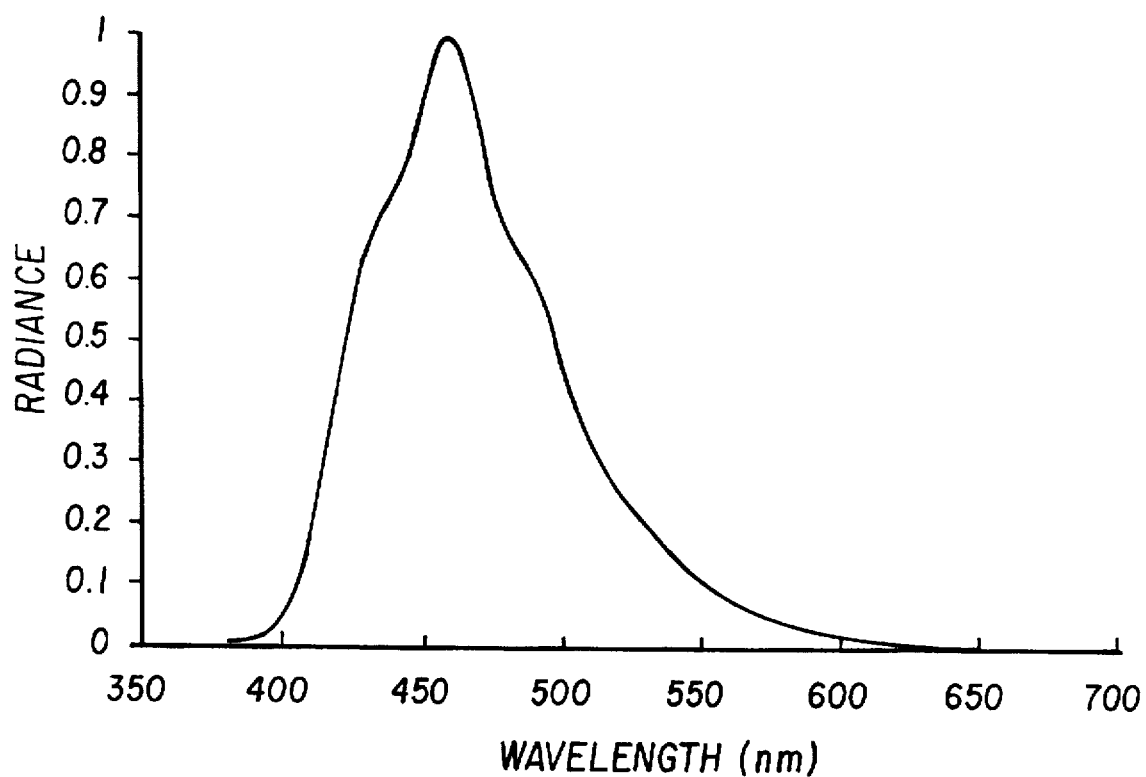
FIG. 4 shows the spectral characteristic of an EL device described in example 3.

The light output from this EL device was 348 cd/m$^2$ when it was driven by a current source of 20 mA/cm$^2$ and a bias voltage of 7.3 volts. The EL color is blue with 1931 CIE color coordinates of X=0.153 and Y=0.157. The EL spectrum shown in FIG. 4 has a peak emission at 460 nm. This EL spectrum indicates that EL emission originates from the electron-transport TPBI layer.

Example 4
An EL device satisfying the requirements of the invention was constructed in the following manner. The device structure has a two organic layers, namely, a hole transport layer and a electron-transport layer.

a) An ITO glass substrate was sequentially ultrasonicated in a commercial detergent, rinsed in deionized water, degreased in toluene vapor and exposed to ultraviolet light and ozone for a few minutes.

b) A hole injection layer of copper phthalocyanine (150 Å) was then deposited on top of the ITO coated substrate by evaporation from a tantalum boat.

c) A hole transport layer (600 Å) of N,N'-bis-(1-naphthyl)-N,N'-diphenylbenzidine was then deposited on top of the ITO glass, also by evaporation from a tantalum boat.

d) A luminescent layer of Alq (375 Å) was then deposited onto the hole transport layer.

e) An electron-transport layer TPBI (375 Å) was then deposited onto the luminescent layer.

f) On top of the electron-transport layer was deposited a cathode (2000 Å) formed of a 10:1 atomic ratio of Mg and Ag.

The above sequence completed the deposition of the EL device. The device was then hermetically packaged in a dry glove box for protection against ambient environment.

The light output from this EL device was 631 cd/m$^2$ when it was driven by a current source of 20 mA/cm$^2$ and a bias voltage of 8.9 volts. The EL color is green with 1931 CIE color coordinates of X=0.316 and Y=0.557. The EL spectrum has a peak emission at 528 nm.

Example 5
An EL device satisfying the requirements of the invention was constructed in the following manner. The device structure has a two organic layers, namely, a hole transport layer and a electron-transport layer.

a) An ITO glass substrate was sequentially ultrasonicated in a commercial detergent, rinsed in deionized water, degreased in toluene vapor and exposed to ultraviolet light and ozone for a few minutes.

b) A hole injection layer of copper phthalocyanine (150 Å) was then deposited on top of the ITO coated substrate by evaporation from a tantalum boat.

c) a hole transport layer (600 Å) of N,N'-bis-(1-naphthyl)-N,N'-diphenylbenzidine was then deposited on top of the ITO glass, also by evaporation from a tantalum boat.

d) A luminescent layer of 4,4'-bis-[(2,2-diphenyl)ethenyl]-1,1-biphenyl (300 Å) was then deposited onto the hole transport layer.

e) An electron-transport layer TPBI (200 Å) was then deposited onto the luminescent layer.

f) On top of the electron-transport layer was deposited a cathode (2000 Å) formed of a 10:1 atomic ratio of Mg and Ag.

The above sequence completed the deposition of the EL device. The device was then hermetically packaged in a dry glove box for protection against ambient environment.

The light output from this EL device was 537 cd/m$^2$ when it was driven by a current source of 20 mA/cm$^2$. The EL color is blue with 1931 CIE color coordinates of X=0.154 and Y=0.159. The EL spectrum has a peak emission at 460 nm.

Example 6
An EL device satisfying the requirements of the invention was constructed in the following manner. The device structure has a two organic layers, namely, a hole transport layer and a electron-transport layer.

a) An ITO glass substrate was sequentially ultrasonicated in a commercial detergent, rinsed in deionized water, degreased in toluene vapor and exposed to ultraviolet light and ozone for a few minutes.

b) A hole injection layer of copper phthalocyanine (150 Å) was then deposited on top of the ITO coated substrate by evaporation from a tantalum boat.

c) a hole transport layer (600 Å) of N,N'-bis-(1-naphthyl)-N,N'-diphenylbenzidine was then deposited on top of the ITO glass, also by evaporation from a tantalum boat.

d) A luminescent layer of bis(2-methyl-8-quinolinolato)(2,3-dimethylphenolato)aluminum(III) (B-Alq, 375 Å) was then deposited onto the hole transport layer.

e) An electron-transport layer TPBI (375 Å) was then deposited onto the luminescent layer.

f) On top of the electron-transport layer was deposited a cathode (2000 Å) formed of a 10:1 atomic ratio of Mg and Ag.

The above sequence completed the deposition of the EL device. The device was then hermetically packaged in a dry glove box for protection against ambient environment.

The light output from this EL device was 666 cd/m² when it was driven by a current source of 20 mA/cm². The EL color is blue-green with 1931 CIE color coordinates of X=0.208 and Y=0.360. The EL spectrum has a peak emission at 492 nm.

Example 7

An EL devices constructed in a manner similar to Example 6, except that the electron-transport layer is Alq (375A) instead of TPBI. The luminance output of this EL device was 460 cd/m² when it was driven by a current source of 20 mA/cm². The CIE color co-ordinates are X=0.214 and Y=0.373. The EL spectrum has a peak emission at 492 nm. This example illustrates that TBPI as an electron-transport material produces a more efficient EL devices than Alq.

The invention has been described in detail with particular reference to certain preferred embodiments thereof, but it will be understood that variations and modifications can be effected within the spirit and scope of the invention.

PARTS LIST

100 EL Device
102 Substrate
104 Anode
106 Cathode
108 Organic EL medium
110 Hole-transport layer
112 Electron-transport layer
114 External power source
116 Conductor
118 Conductor
120 Holes
122 Electrons
200 El device
202 Substrate
204 Anode
206 Cathode
208 Organic EL medium
210 Hole-transport layer
212 Luminescent layer
214 Electron-transport layer
300 EL device
302 Substrate
304 Anode
306 Cathode
308 Organic EL medium
310 Hole-injection layer
312 Hole-transport layer
314 Luminescent layer
316 Electron-transport layer
318 Electron-injection layer

What is claimed is:

1. An organic EL device, comprising an anode and a cathode, and at least one electron transporting layer containing a compound of benzazoles of formula:

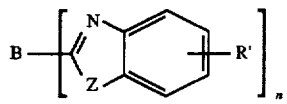

Formula I wherein:

n is an integer of from 3 to 8;

Z is O, NR or S;

R and R' are individually hydrogen; alkyl of from 1 to 24 carbon atoms; aryl or hetero-atom substituted aryl of from 5 to 20 carbon atoms; or halo; or atoms necessary to complete a fused aromatic ring; and B is a linkage unit consisting of alkyl, aryl, substituted alkyl, substituted aryl, or heteroaryl selected from the group consisting of

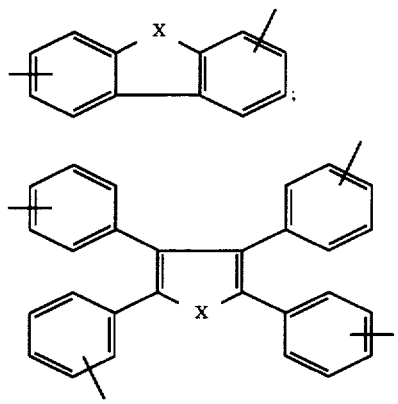

in which X is O, S, $SO_2$, $CH_2$, $CHR^1$, $CR^2R^3$, or $NR^4$; and $R^1$, $R^2$, $R^3$, and $R^4$ are individually hydrogen; saturated aliphatic of from 1 to 24 carbon atoms; aryl or hetero-atom substituted aryl of from 6 to 20 carbon atoms; or halo; or $R^1$, $R^2$, $R^3$, and $R^4$ individually comprise the atoms necessary to complete a fused aromatic ring;

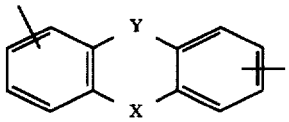

which X and Y are individually O, S, $SO_2$, $CH_2$, $CHR^1$, $CR^2R^3$, or $NR^4$; and $R^1$, $R^2$, $R^3$, and $R^4$ are individually hydrogen; saturated aliphatic of from 1 to 24 carbon atoms; aryl or hetero-atom substituted aryl of from 6 to 20 carbon atoms; or halo; or $R^1$, $R^2$, $R^3$, and $R^4$ individually comprise the atoms necessary to complete a fused aromatic ring;

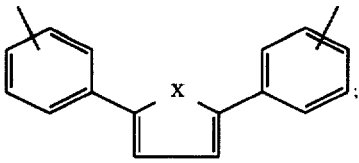

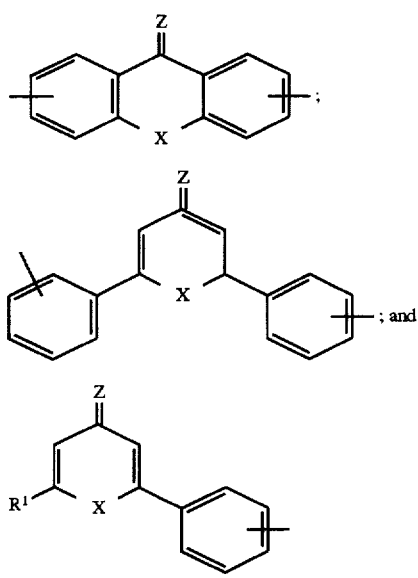

in which Z is O or C(CN)$_2$, X is O, S, SO$_2$, CH$_2$, CHR$^1$, CR$^2$R$^3$, or NR$^4$; and R$^1$, R$^2$, R$^3$, and R$^4$ are individually hydrogen; saturated aliphatic of from 1 to 24 carbon atoms; aryl or hetero-atom substituted aryl of from 6 to 20 carbon atoms; or halo; or R$^1$, R$^2$, R$^3$, and R$^4$ individually comprise the atoms necessary to complete a fused aromatic ring;

wherein B conjugately or unconjugately connects the multiple benzazoles together.

2. An organic EL device according to claim 1, wherein the linkage unit B is:

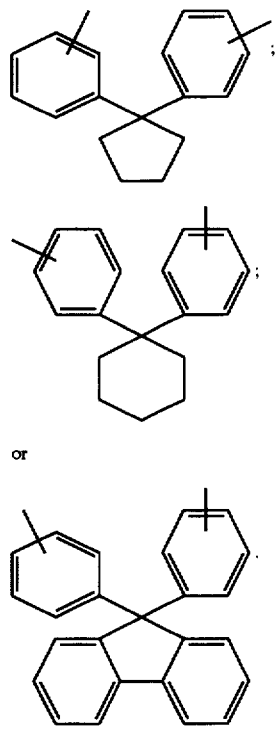

3. An organic EL device according to claim 1 wherein the linkage unit B is:

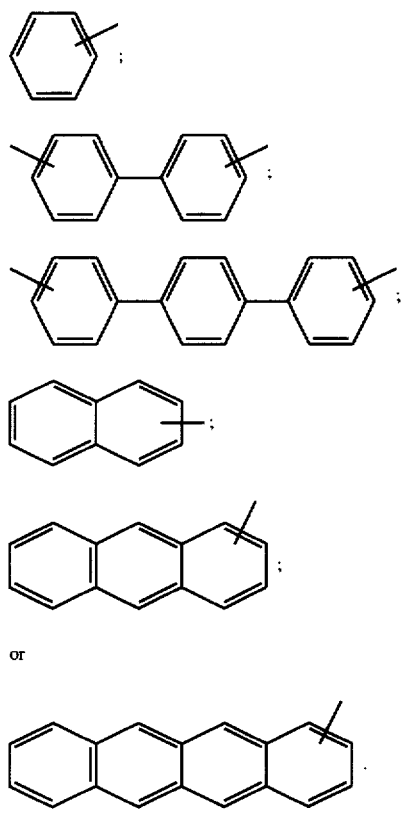

or

4. An organic EL device according to claim 1 wherein the linkage unit B is:

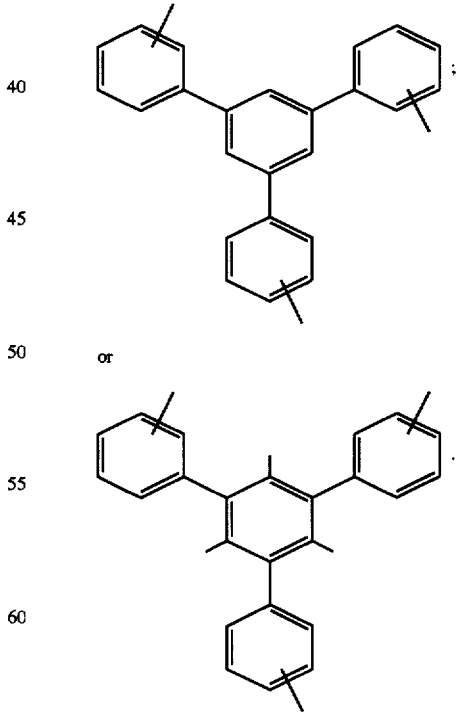

or

5. An organic EL device according to claim 1 wherein the linkage unit B is:

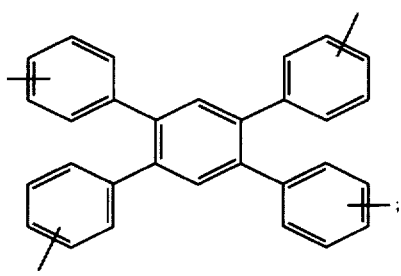

or

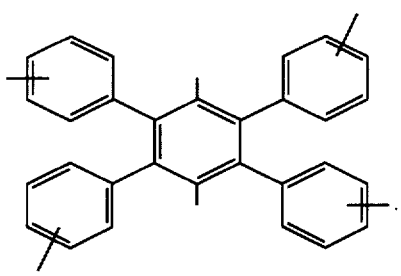

6. An organic EL device according to claim 1 wherein the linkage unit B is:

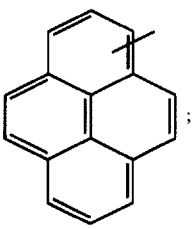

or

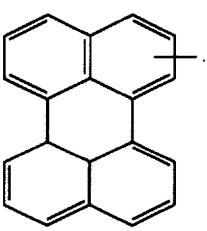

7. An organic EL device according to claim 1 wherein the linkage unit B consists of:

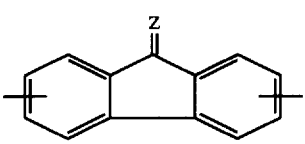

in which Z is O or C(CN)$_2$.

8. An organic EL device according to claim 1 wherein the linkage unit B is

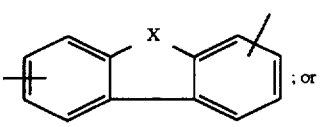

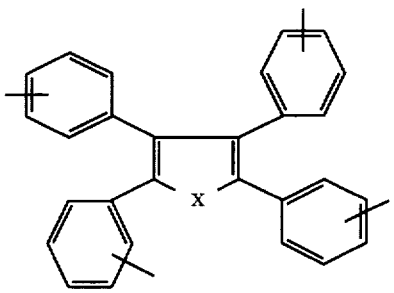

in which X is O, S, SO$_2$, CH$_2$, CHR$^1$, CR$^2$R$^3$, or NR$^4$; and R$^1$, R$^2$, R$^3$, and R$^4$ are individually hydrogen; saturated aliphatic of from 1 to 24 carbon atoms; aryl or hetero-atom substituted aryl of from 6 to 20 carbon atoms; or halo; or R$^1$, R$^2$, R$^3$, and R$^4$ individually comprise the atoms necessary to complete a fused aromatic ring.

9. An organic EL device according to claim 1 wherein the linkage unit B is

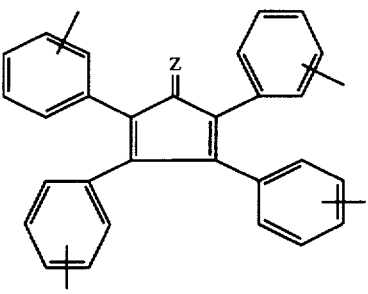

in which Z is O or C(CN)$_2$; or

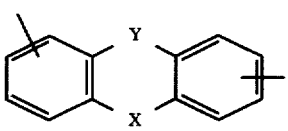

in which X and Y are individually O, S, SO$_2$, CH$_2$, CHR$^1$, CR$^2$R$^3$, or NR$^4$; and R$^1$, R$^2$, R$^3$, and R$^4$ are individually hydrogen; saturated aliphatic of from 1 to 24 carbon atoms; aryl or hetero-atom substituted aryl of from 6 to 20 carbon atoms; or halo; or R$^1$, R$^2$, R$^3$, and R$^4$ individually comprise the atoms necessary to complete a fused aromatic ring.

10. An organic EL device according to claim 1 wherein the linkage unit B is

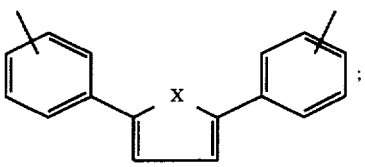

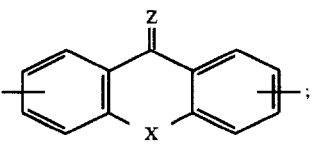

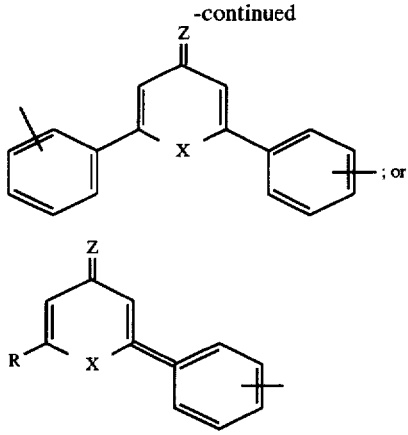

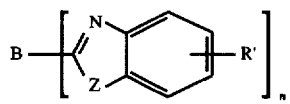

in which Z is O or C(CN)$_2$, X is O, S, SO$_2$, CH$_2$, CHR$^1$, CR$^2$R$^3$, or NR$^4$; and R$^1$, R$^2$, R$^3$, and R$^4$ are individually hydrogen; saturated aliphatic of from 1 to 24 carbon atoms; aryl or hetero-atom substituted aryl of from 6 to 20 carbon atoms; or halo; or R$^1$, R$^2$, R$^3$, and R$^4$ individually comprise the atoms necessary to complete a fused aromatic ring.

11. An electron transporting layer for use in an electronic device wherein the improvement comprsises the electron transporting layer containing a compound of benzazoles of formula:

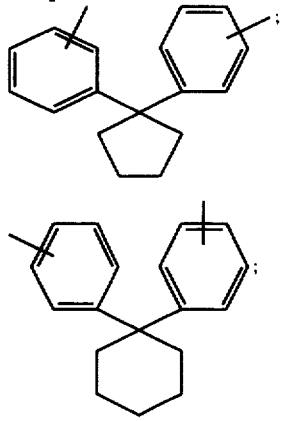

Formula I wherein:

n is an integer of from 3 to 8;

Z is O, NR or S; and

R and R' are individually hydrogen; alkyl of from 1 to 24 carbon atoms; aryl or hetero-atom substituted aryl of from 5 to 20 carbon atoms; or halo; or atoms necessary to complete a fused aromatic ring; and wherein the linkage unit B is a moiety selected from one of the following groups:

Group 1:

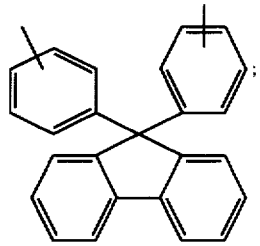

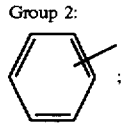

;

or

Group 2:

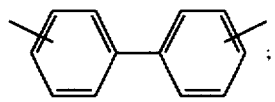

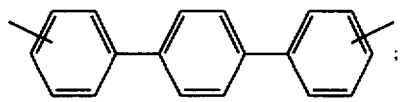

;

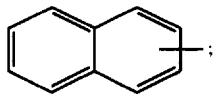

;

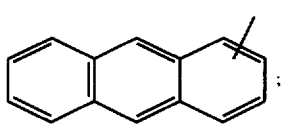

;

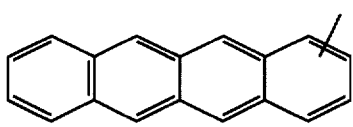

;

or

Group 3:

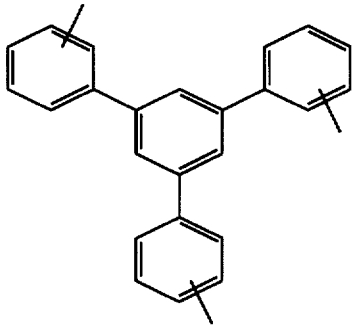

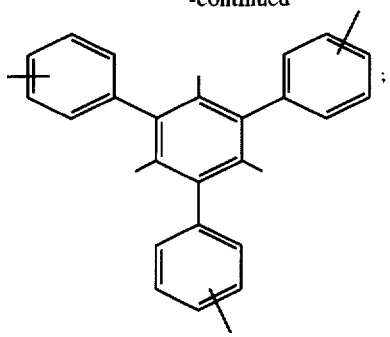

or

Group 4:

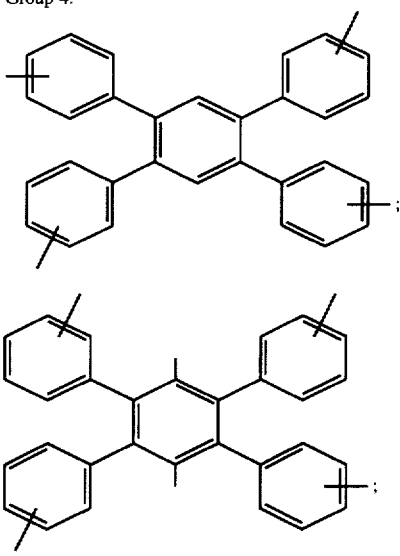

or

Group 5:

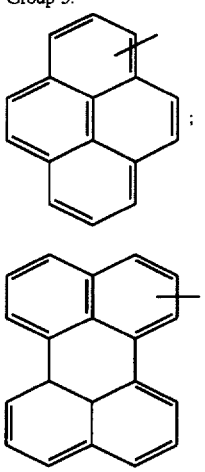

or

Group 6:

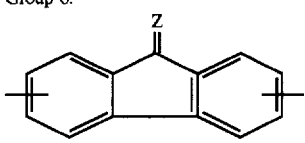

in which Z is O or C(CN)$_2$;

or

Group 7:

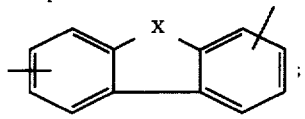

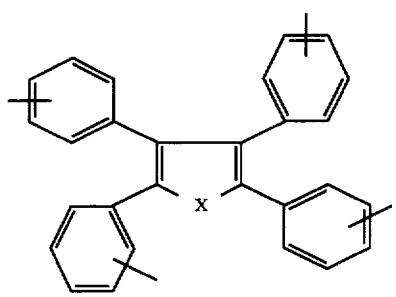

in which X is O, S, SO$_2$, CH$_2$, CHR$^1$, CR$^2$R$_3$, or NR$^4$; and R$^1$, R$^2$, R$^3$, and R$^4$ are individually hydrogen; saturated aliphatic of from 1 to 24 carbon atoms; aryl or hetero-atom substituted aryl of from 6 to 20 carbon atoms; or halo; or R$^1$, R$^2$, R$^3$, and R$^4$ individually comprise the atoms necessary to complete a fused aromatic ring;

Group 8:

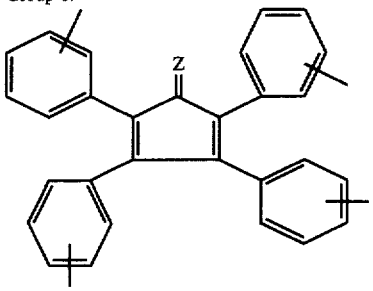

in which Z is O or C(CN)$_2$;

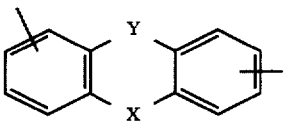

in which X and Y are individually O, S, SO$_2$, CH$_2$, CHR$^1$, CR$^2$R$^3$, or NR$^4$; and R$^1$, R$^2$, R$^3$, and R$^4$ are individually hydrogen; saturated aliphatic of from 1 to 24 carbon atoms; aryl or hetero-atom substituted aryl of from 6 to 20 carbon atoms; or halo; or R$^1$, R$^2$, R$^3$, and R$^4$ individually comprise the atoms necessary to complete a fused aromatic ring; or Group 9:

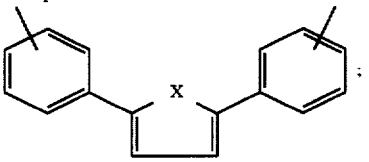

-continued

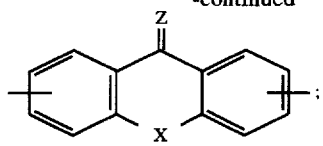

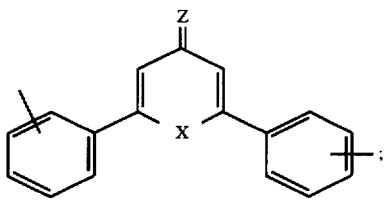

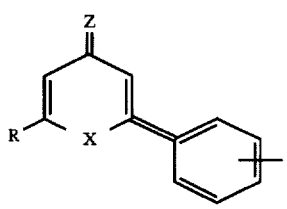

in which Z is O or C(CN)$_2$, X is O, S, SO$_2$, CH$_2$, CHR$^1$, CR$^2$R$^3$, or NR$^4$; and R$^1$, R$^2$, R$^3$, and R$^4$ are individually hydrogen; saturated aliphatic of from 1 to 24 carbon atoms; aryl or hetero-atom substituted aryl of from 6 to 20 carbon atoms; or halo; or R$^1$, R$^2$, R$^3$, and R$^4$ individually comprise the atoms necessary to complete a fused aromatic ring.

12. An organic EL device, comprising an anode and a cathode, and at least one electron transporting layer containing a compound of benzazoles of formula:

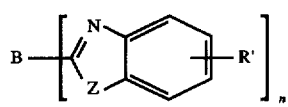     Formula I wherein:
n is an integer of from 2 to 8;
Z is O, NR or S; and
R and R' are individually hydrogen; alkyl of from 1 to 24 carbon atoms; aryl or hetero-atom substituted aryl of from 5 to 20 carbon atoms; or halo; or atoms necessary to complete a fused aromatic ring; and
wherein the linkage unit B is a moiety selected from one of the following groups:

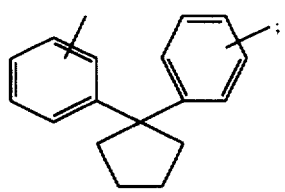

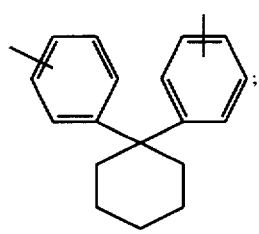

-continued

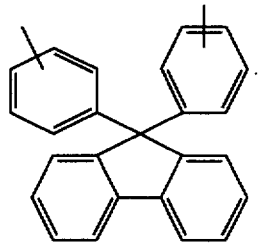

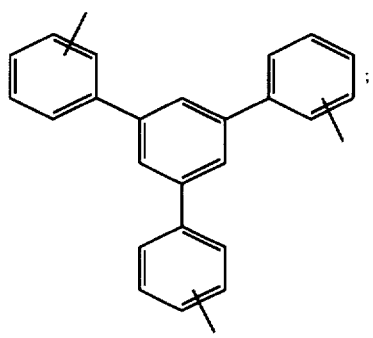

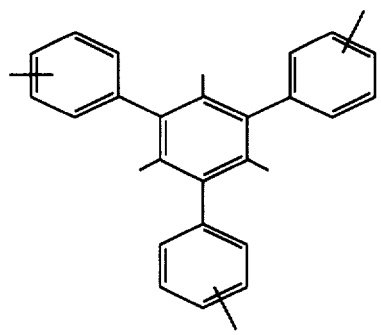

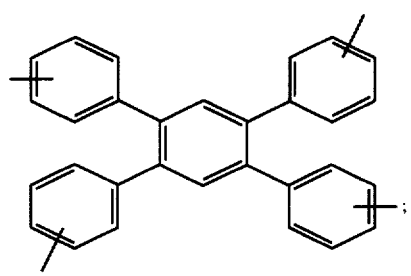

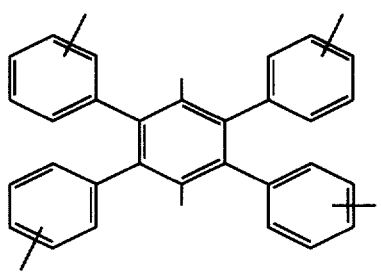

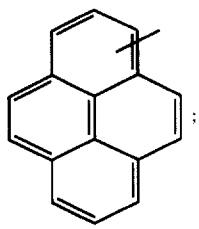

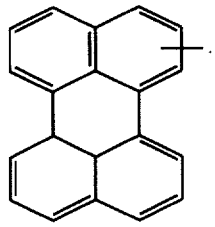

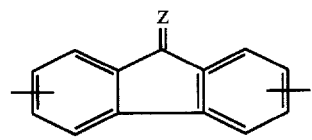

in which Z is O or C(CN)$_2$;

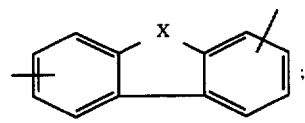

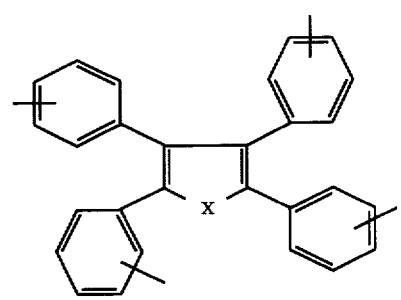

in which X is O, S, SO$_2$, CH$_2$, CHR$^1$, CR$^2$R$^3$, or NR$^4$; and R$^1$, R$^2$, R$^3$, and R$^4$ are individually hydrogen; saturated aliphatic of from 1 to 24 carbon atoms; aryl or hetero-atom substituted aryl of from 6 to 20 carbon atoms; or halo; or R$^1$, R$^2$, R$^3$, and R$^4$ individually comprise the atoms necessary to complete a fused aromatic ring;

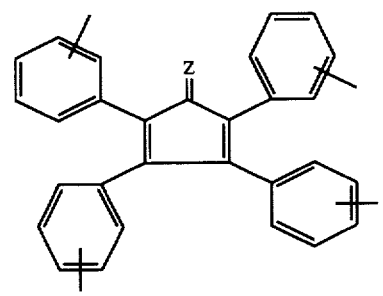

in which Z is O or C(CN)$_2$; and

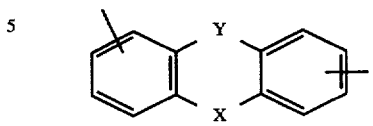

in which X and Y are individually O, S, SO$_2$, CH$_2$, CHR$^1$, CR$^2$R$^3$, or NR$^4$; and R$^1$, R$^2$, R$^3$, and R$^4$ are individually hydrogen; saturated aliphatic of from 1 to 24 carbon atoms; aryl or hetero-atom substituted aryl of from 6 to 20 carbon atoms; or halo; or R$^1$, R$^2$, R$^3$, and R$^4$ individually comprise the atoms necessary to complete a fused aromatic ring;

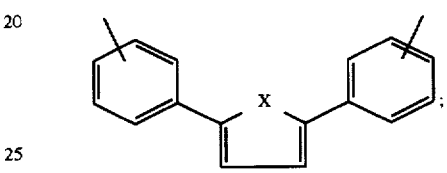

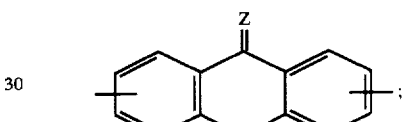

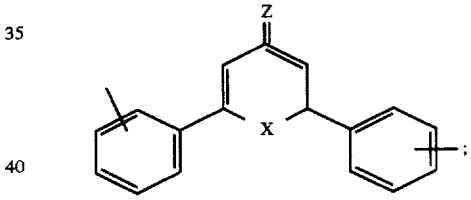

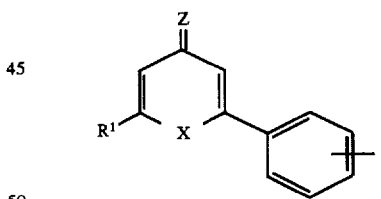

in which Z is O or C(CN)$_2$, X is O, S, SO$_2$, CH$_2$, CHR$^1$, CR$^2$R$^3$, or NR$^4$; and R$^1$, R$^2$, R$^3$, and R$^4$ are individually hydrogen; saturated aliphatic of from 1 to 24 carbon atoms; aryl or hetero-atom substituted aryl of from 6 to 20 carbon atoms; or halo; or R$^1$, R$^2$, R$^3$, and R$^4$ individually comprise the atoms necessary to complete a fused aromatic ring.

* * * * *

UNITED STATES PATENT AND TRADEMARK OFFICE
CERTIFICATE OF CORRECTION

PATENT NO. : 5,766,779
DATED : 16 June 1998
INVENTOR(S) : Jiamin Shi, et al

It is certified that error appears in the above-identified patent and that said Letters Patent is hereby corrected as shown below:

Column 12, line 15, delete "R" in the structure and insert -- $R^1$ --.

Column 35, line 15, delete "R" in the structure and insert -- $R^1$ --.

Column 35, line 26, delete "comprsises" and insert -- comprises --.

Column 38, line 25, delete "$CR^2R_3$" and insert -- $CR^2R^3$ --.

Column 38, line 30, afater "ring;" insert -- or --.

Column 39, line 20 delete "R" in the structure and insert -- $R^1$ --.

Signed and Sealed this

Second Day of March, 1999

Attest:

Q. TODD DICKINSON

*Attesting Officer*   Acting Commissioner of Patents and Trademarks